(12) United States Patent
Lee et al.

(10) Patent No.: US 7,144,686 B2
(45) Date of Patent: Dec. 5, 2006

(54) METHOD OF FORMING AN ACTIVE MATRIX ORGANIC LIGHT EMITTING DISPLAY

(75) Inventors: Hsin-Hung Lee, Taipei (TW); Kuo-Ting Lee, Taoyuan (TW)

(73) Assignee: Au Optronics Corp., Hsinchu (TW)

( * ) Notice: Subject to any disclaimer, the term of this patent is extended or adjusted under 35 U.S.C. 154(b) by 270 days.

(21) Appl. No.: 10/439,719

(22) Filed: May 16, 2003

(65) Prior Publication Data
US 2003/0216100 A1 Nov. 20, 2003

(30) Foreign Application Priority Data
May 17, 2002 (TW) .............................. 91110431 A

(51) Int. Cl.
*H01J 9/227* (2006.01)
(52) U.S. Cl. .............. 430/317; 430/318; 430/319; 430/321; 438/29; 438/34; 438/35
(58) Field of Classification Search .............. 430/321, 430/317, 318, 319; 313/504; 438/29, 34, 438/35
See application file for complete search history.

(56) References Cited
U.S. PATENT DOCUMENTS
5,834,796 A * 11/1998 Matsuda et al. .............. 257/57

6,784,032 B1 * 8/2004 Lee et al. .................... 438/149

OTHER PUBLICATIONS

Abstract of KR 2001-027787 A, "Active Matrix Electroluminescent Display Device". Bae et al., Apr. 2001.*

* cited by examiner

*Primary Examiner*—John A. McPherson
(74) *Attorney, Agent, or Firm*—Ladas & Parry LLP

(57) ABSTRACT

A method of forming an active matrix organic light emitting display. A first photo mask is used to pattern a first scanning line, a bottom electrode and a second scanning line. A second photo mask is used to pattern a first island structure and a second island structure respectively within two predetermined TFT areas. A third photo mask is used to form a via to expose a part of the second scanning line outside the predetermined TFT area. A fourth photo mask is used to pattern a transparent conductive layer as a pixel electrode. A fifth photo mask is used to pattern a second metal layer as a data line and a top electrode, in which an opening is formed in the island structure to define a source/drain electrode and a source/drain diffusion region. A sixth photo mask is used to remove a protective layer from the pixel electrode.

16 Claims, 13 Drawing Sheets

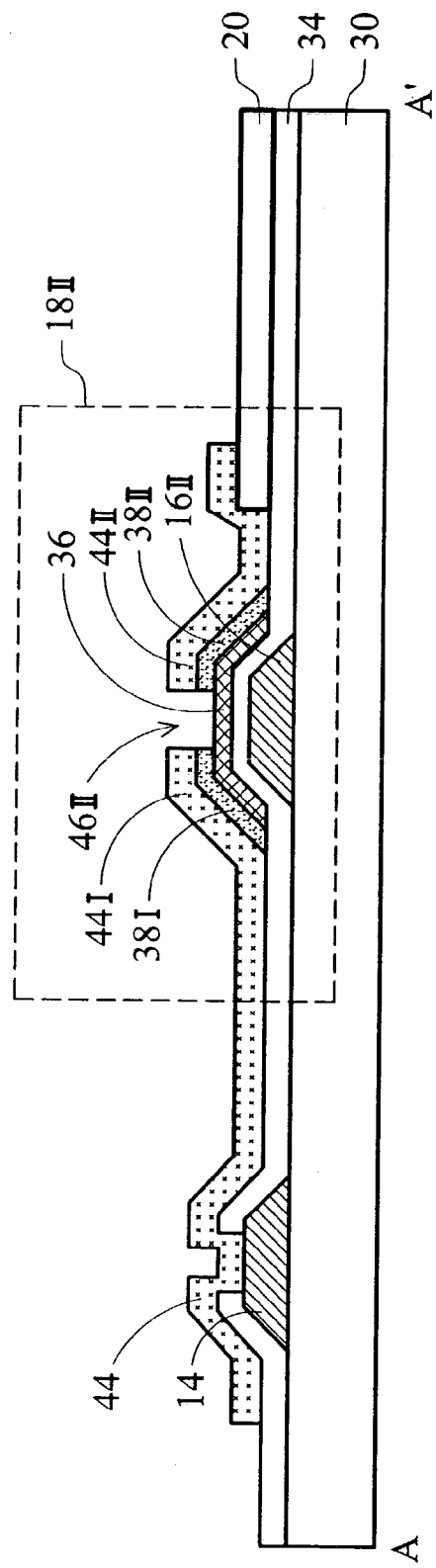
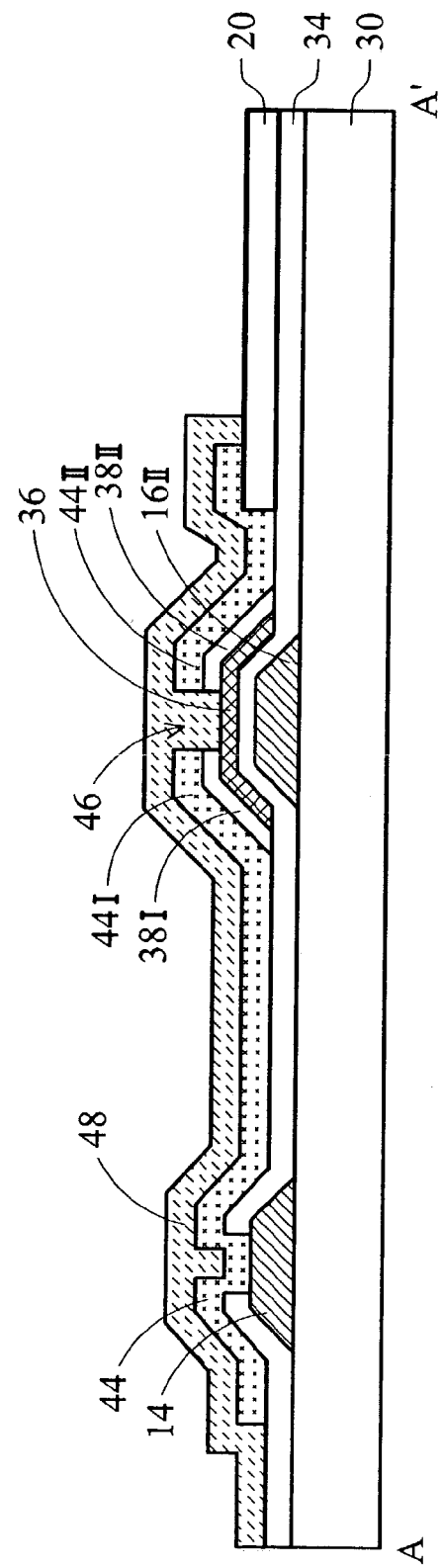
FIG. 2E
FIG. 2F

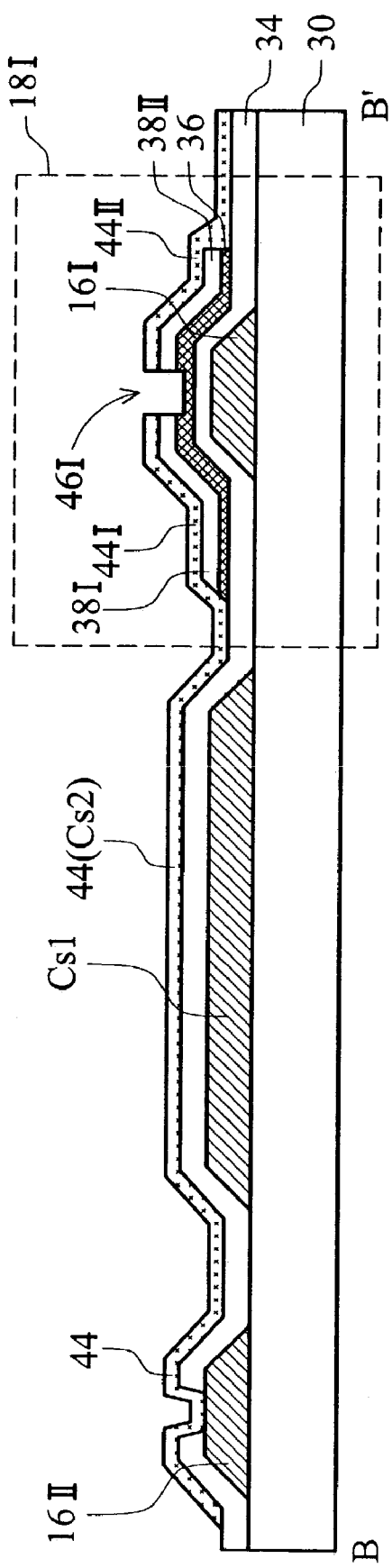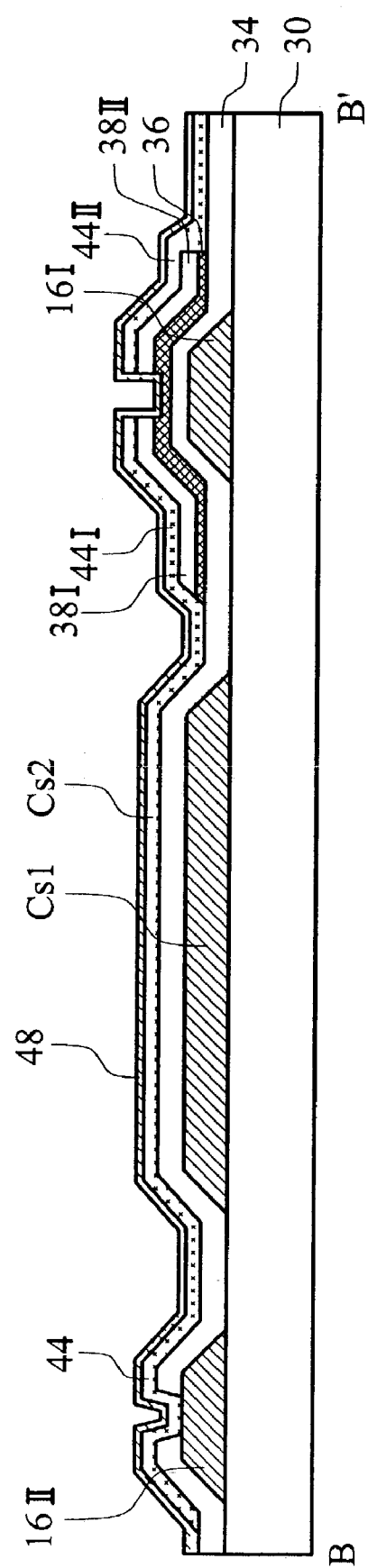

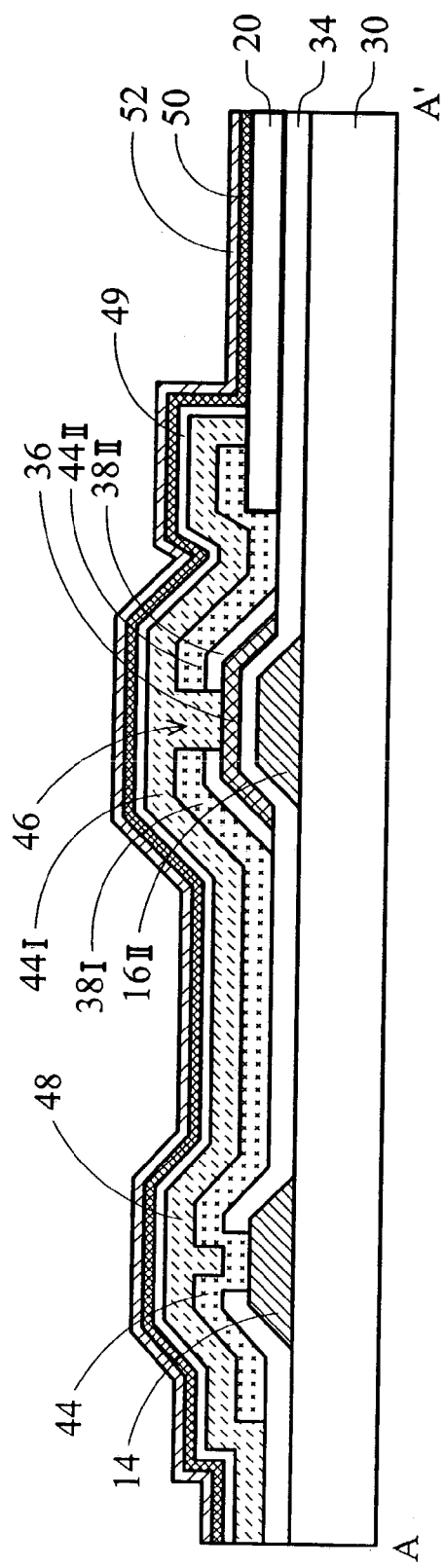
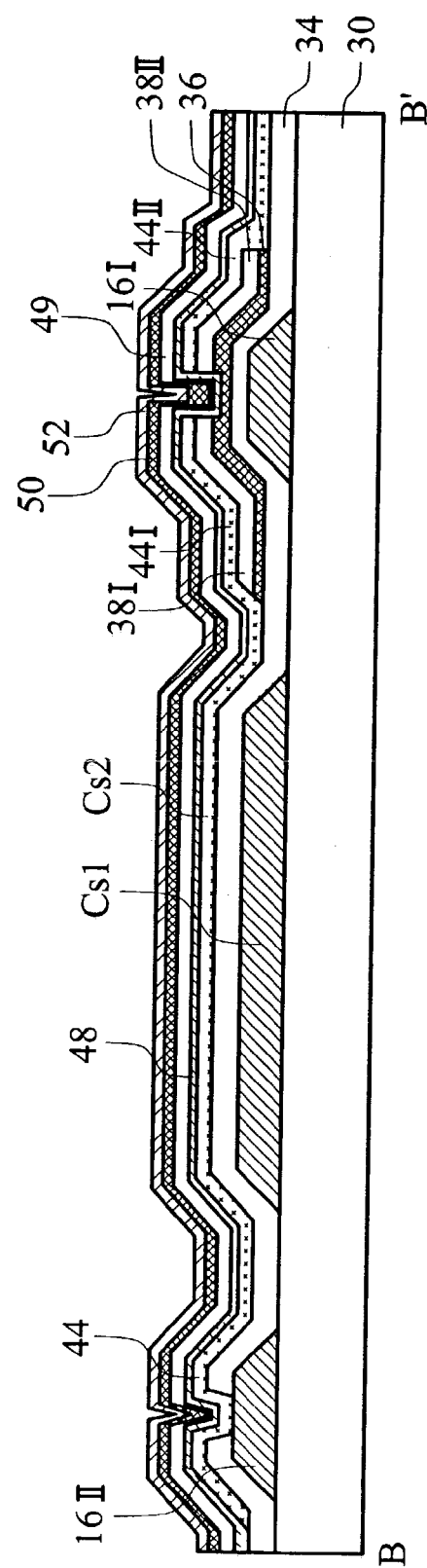
FIG. 4A
FIG. 4B

METHOD OF FORMING AN ACTIVE MATRIX ORGANIC LIGHT EMITTING DISPLAY

BACKGROUND OF THE INVENTION

1. Field of the Invention

The present invention relates to a method of forming an active matrix organic light emitting display (AM-OLED) and, more particularly, to a method of forming an amorphous-silicon thin film transistor (a-Si:H TFT) in an AM-OLED.

2. Description of the Related Art

In accordance with driving methods, organic light emitting displays (OLED) are classified into active and positive matrix types. The active matrix organic light emitting display (AM-OLED) is driven by electric currents, in which each of the matrix-array pixel areas has at least one thin film transistor (TFT), serving as a switch, to modulate the driving current based on the variation of capacitor storage potential so as to control the brightness and gray level of the pixel areas. At present, the AM-OLED is driven by two TFTs in each pixel area, and alternatively the AM-OLED is driven by four TFTs in each pixel area.

Concerned with the fabrication of the TFTs, a polysilicon TFT has advantages of high mobility, great integration of driving circuits, small leakage current and good applications for high-speed devices, thus the current TFT process for the AM-OLED application has a tendency toward a low-temperature polysilicon (LTPS). However, the LTPS requires a lengthy photolithography-etching process, including as many as eight or nine photolithography-etching steps, resulting in high process costs, degraded yield and a difficulty in mass production of large-size panel applications. Comparatively, an amorphous silicon (a-Si:H) TFT process with superior process costs and product properties, with as few as five or six photolithography-etching steps, has been popularly applied to the fabrication of large-size liquid crystal displays (LCDs) Accordingly, integration of the a-Si:H TFT process into the AM-OLED process is currently an important issue.

SUMMARY OF THE INVENTION

The present invention provide a method of forming an a-Si:H TFT in an AM-OLED to solve the above-described problems.

In the method of forming an active matrix organic light emitting display, a first metal layer is formed on a transparent insulating substrate and then a first photolithography-etching process is used to pattern the first metal layer as a first scanning line extending along an X direction, a bottom electrode of a capacitor and a second scanning line extending along the X direction. Next, a gate-insulating layer, an amorphous silicon layer and a doped amorphous silicon layer are successively formed on the entire surface of the transparent insulating substrate. Next, using a second photolithography-etching process, the amorphous silicon layer and the doped amorphous silicon layer are patterned as a first island structure and a second island structure respectively within two predetermined TFT areas over the first scanning line and the second scanning line, in which the amorphous silicon layer and the doped amorphous silicon layer disposed outside the two predetermined TFT areas are removed. Then, using a third photolithography-etching process, a via is formed in the gate-insulating layer to expose a part of the second scanning line outside the predetermined TFT area. Thereafter, a transparent conductive layer is formed on the entire surface of the transparent insulating substrate. Then, using a fourth photolithography-etching process, the transparent conductive layer is patterned as a pixel electrode. Next, a second metal layer is formed on the entire surface of the transparent insulating substrate. Then, using a fifth photolithography-etching process, the second metal layer is patterned as a data line extending along a Y direction and a top electrode of the capacitor, in which a first opening and a second opening are respectively formed in the first island structure and the second island structure until exposing the amorphous silicon layer to separate the second metal layer as a source/drain electrode and separate the doped amorphous silicon layer as a source/drain diffusion region. Finally, a protective layer is formed on the entire surface of the transparent insulating substrate, and then a sixth photolithography-etching process is employed to remove the protective layer from the pixel electrode.

Further, an organic luminescent layer is formed on the entire surface of the transparent insulating layer, and then a cathode metal layer is formed on the organic luminescent layer.

In another case, before forming the organic luminescent layer, a shielding layer is formed on the entire surface of the transparent insulating layer, and the shielding layer is patterned to remain on the protective layer, shield the amorphous silicon layer, and expose the pixel electrode.

Another object of the invention to effectively increase process costs

Yet another object of the invention is to improve the yield of the a-Si:H TFT.

It is a further object of the invention to provide capability of mass production in large-size panel applications Still another object of the invention is to increase the on-current of the a-Si:H TFT.

These and other objects of the present invention will become readily apparent upon further review of the following specification and drawings.

BRIEF DESCRIPTION OF THE DRAWINGS

FIGS. 2A to 2G are cross-sections along line A–A' of FIG. 1 to show the a-Si:H TFT process of the AM-OLED according to the first embodiment of the present invention.

FIGS. 3A to 3G are cross-sections along line B–B' of FIG. 1 to show the a-Si:H TFT process of the AM-OLED according to the first embodiment of the present invention.

FIG. 4A is a cross-section along line A–A' of FIG. 1 to show the a-Si:H TFT process of the AM-OLED according to the second embodiment of the present invention.

FIG. 4B is a cross-section along line B–B' of FIG. 1 to show the a-Si:H TFT process of the AM-OLED according to the second embodiment of the present invention.

Similar reference characters denote corresponding features consistently throughout the attached drawings.

DETAILED DESCRIPTION OF THE INVENTION

The present invention provides a method of forming an amorphous silicon (a-Si:H) TFT of an active matrix organic light emitting display (AM-OLED). Since an a-Si:H TFT process is integrated into the AM-OLED process, six photolithography-etching steps are required to complete the electrode array in pixel areas.

[First Embodiment]

Figure 1:
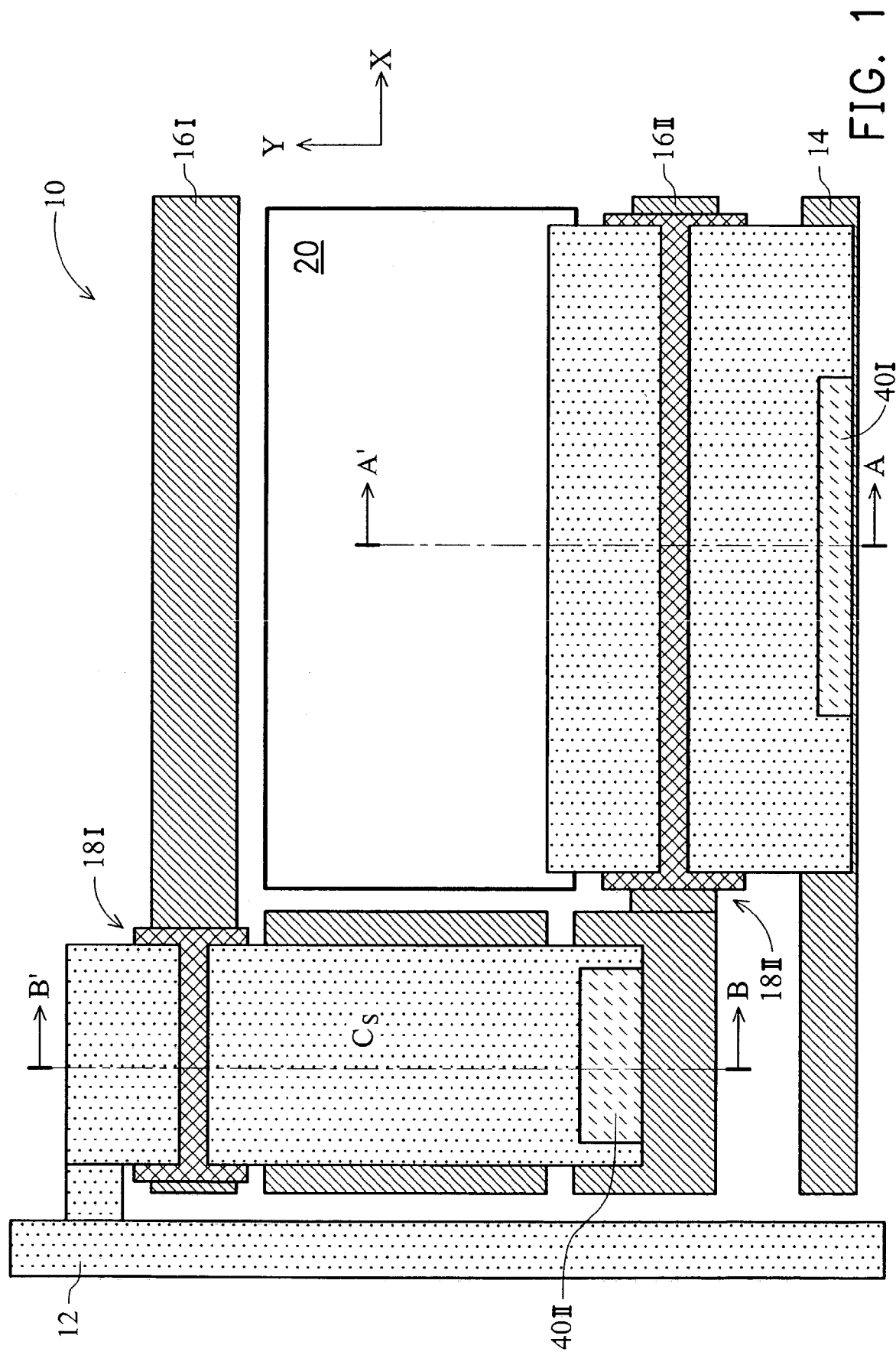
FIG. 1 is a top view showing an a-Si:H TFT of an AM-OLED according to the first embodiment of the present invention.

The use of two a-Si:H TFTs in each pixel area is an example describing the first embodiment of the present invention. FIG. 1 is a top view showing an a-Si: H TFT of an AM-OLED according to the first embodiment of the present invention. The AM-OLED comprises a plurality of pixel areas 10 arranged in a matrix form constituted by a plurality of data lines 12 extending along a Y direction and a plurality of source lines (also called $V_{dd}$ lines) 14 extending along an X direction. Also, each pixel area 10 comprises two scanning lines 16I and 16II extending along the x direction, two a-Si:H TFTs 18I and 18II respectively disposed over the two scanning lines 16I and 16II, a pixel electrode 20 of rectangular-shaped transparent conductive material disposed between the two scanning lines 16I and 16II, and a capacitor Cs.

In general, the a-Si:H TFT process is classified as an etching stopper type and a back channel type. Hereinafter, the use of the etching stopper type is an example describing the a-Si:H TFT process of the present invention.

FIGS. 2A to 2G are cross-sections along line A–A' of FIG. 1 to show the a-Si:H TFT process of the AM-OLED according to the first embodiment of the present invention. FIGS. 3A to 3G are cross-sections along line B–B1" of FIG. 1 to show the a-Si:H TFT process of the AM-OLED according to the first embodiment of the present invention.

Figure 2A:
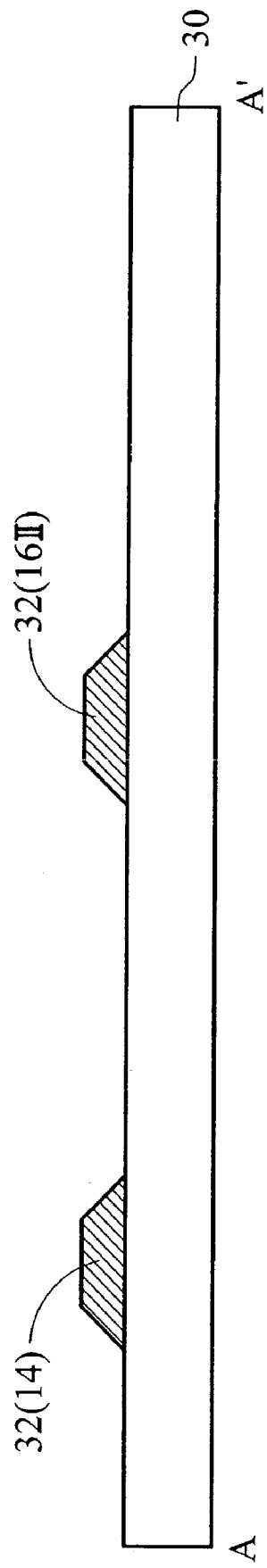
Figure 3A:
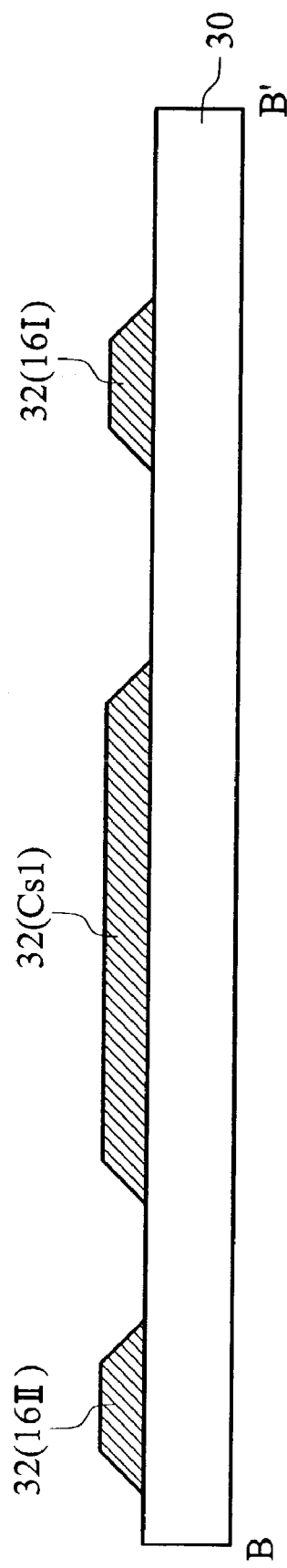

As shown in FIGS. 2A and 3A, a first metal layer 32 is deposited on a transparent insulating substrate 30. Then, using photolithography and etching with a first photo mask, the first metal layer 32 is patterned to form the source line 14, the scanning lines 16I and 16II and a bottom electrode Cs1 of the capacitor Cs.

Figure 2B:
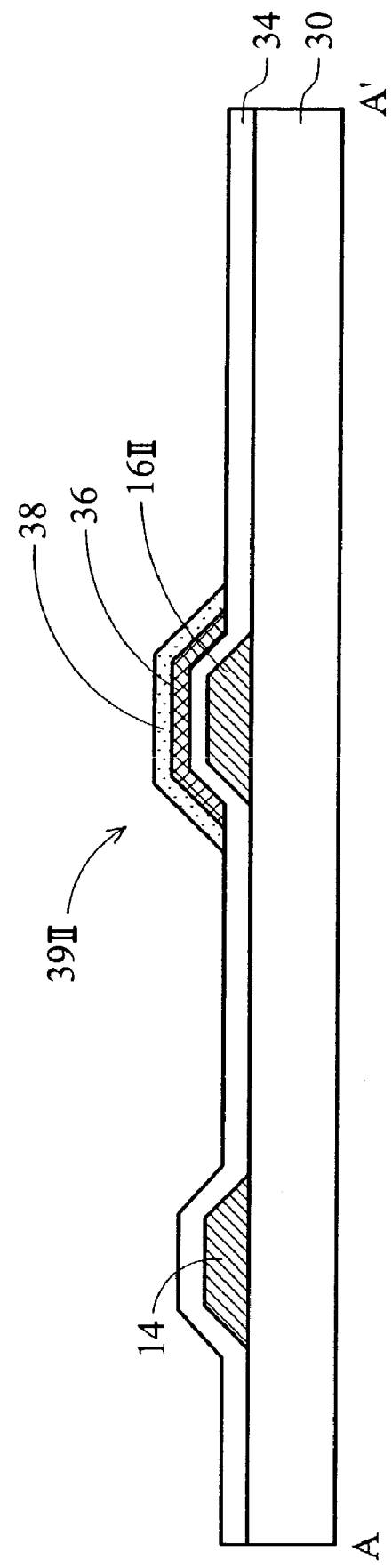
Figure 3B:
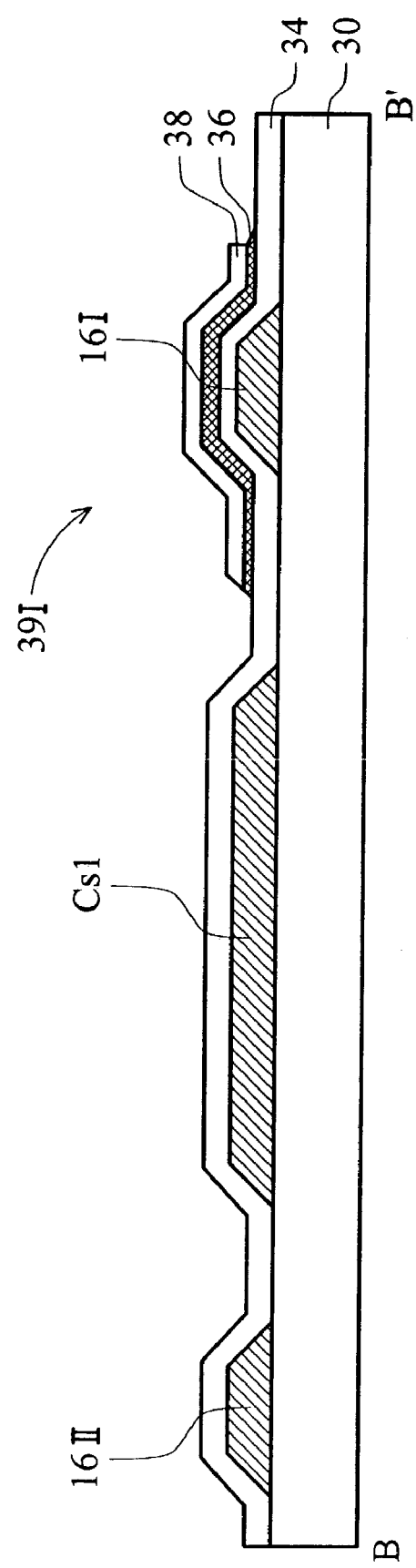

As shown in FIGS. 2B and 3B, a gate-insulating layer 34, an amorphous silicon layer 36 and a doped amorphous silicon layer 38 are successively deposited on the entire surface of the transparent insulating substrate 30. Preferably, the gate-insulating layer 34 is a single-layered structure or a double-layered structure selected from $SiO_2$, SiN and SiON. Next, using photolithography and etching with a second photo mask, parts of the amorphous silicon layer 36 and the doped amorphous silicon layer 38 are removed to form two island structures 39I and 39II within the two a-Si:H TFTs 18I and 18II, respectively. Also, the amorphous silicon layer 36 and the doped amorphous silicon layer 38 disposed on the source line 12, the bottom electrode Cs1 and one end of the scanning line 16II are completely removed.

Figure 2C:
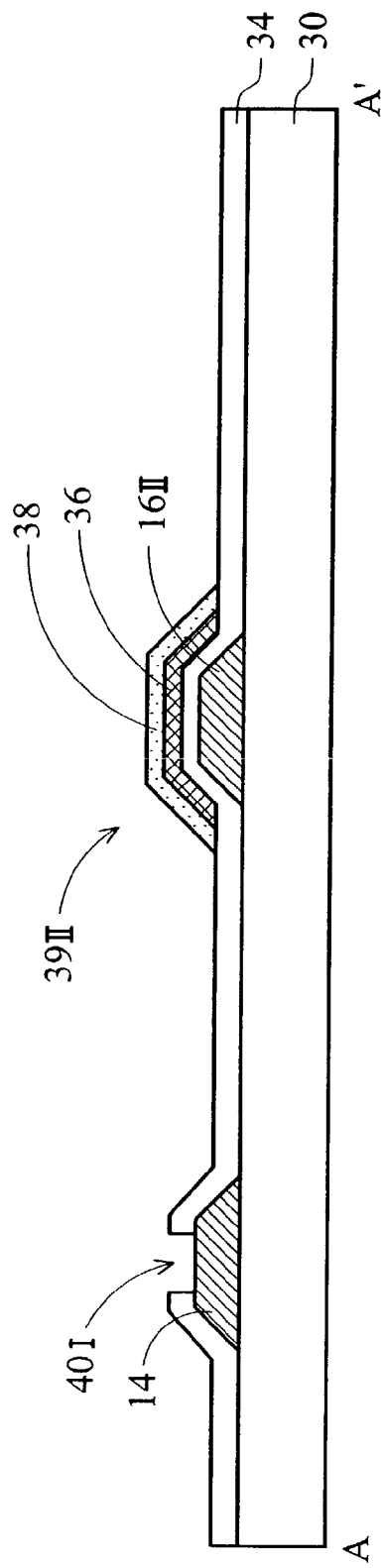
Figure 3C:
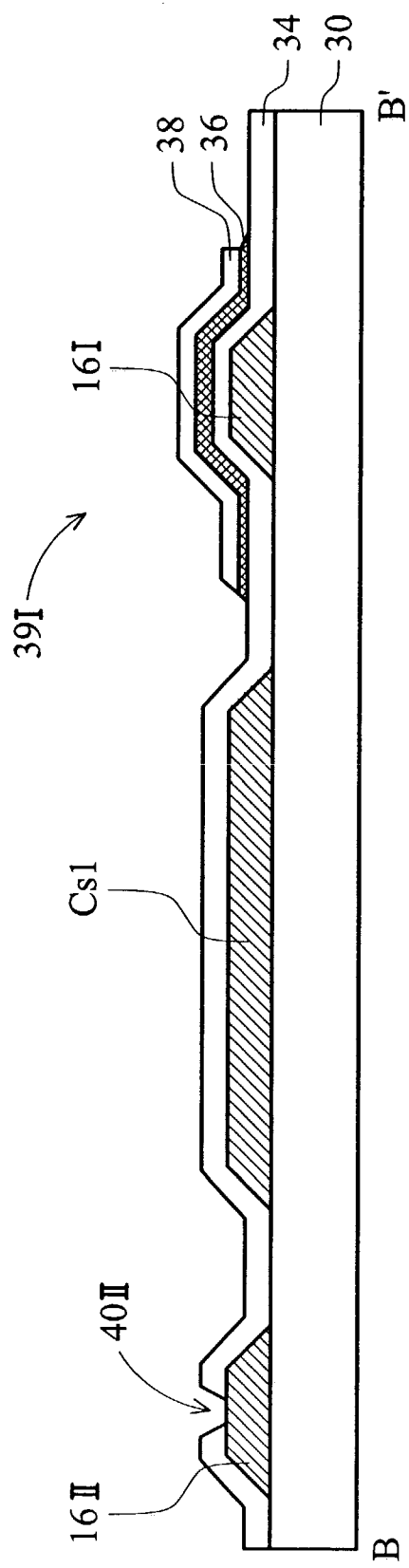

As shown in FIGS. 2C and 3C, using photolithography and etching with a third photo mask, parts of the gate-insulating layer 34 is removed to form a first via 40I that exposes one end of the source line 14 and a second via 40II that exposes one end of the scanning line 16II.

Figure 2D:
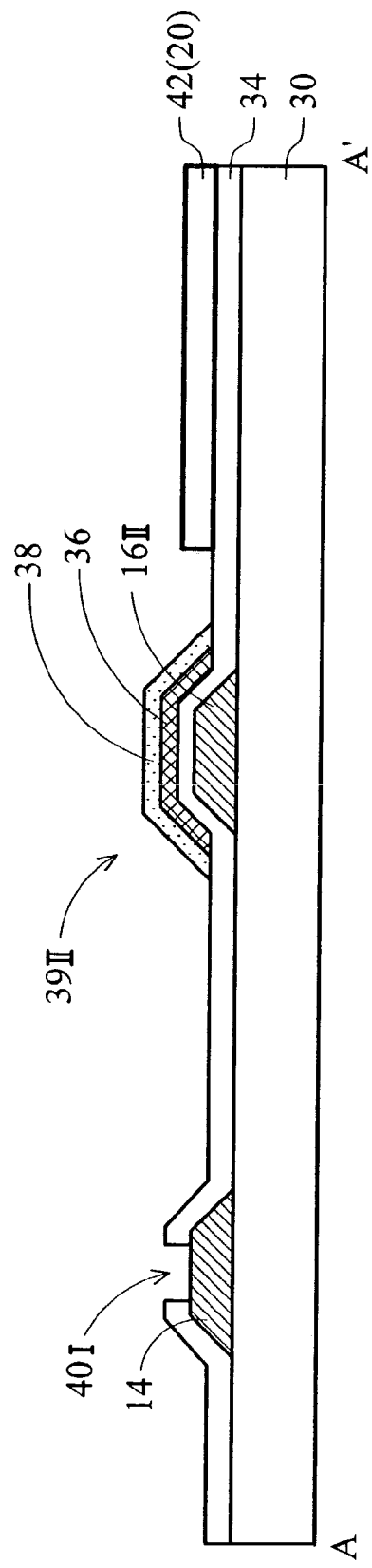
Figure 3D:
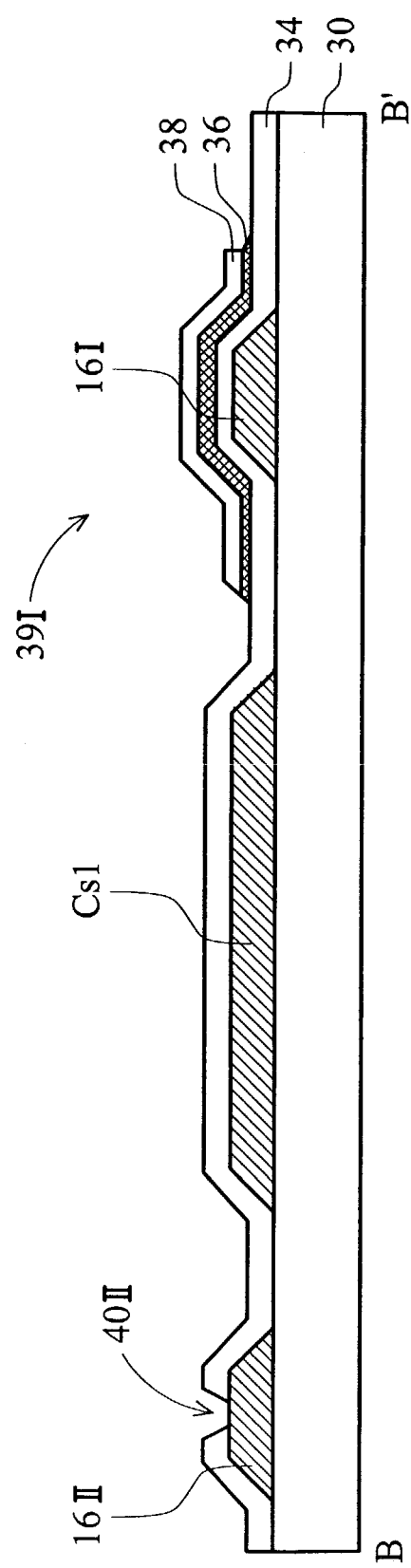

As shown in FIGS. 2D and 3D, a transparent conductive layer 42, such as an ITO layer, is deposited on the entire surface of the transparent insulating substrate 30. Then, using photolithography and etching with a fourth photo mask, the transparent conductive layer 42 is patterned to serve as the pixel electrode 20.

As shown in FIGS. 2E and 3E, a second metal layer 44 is deposited on the entire surface of the transparent insulating substrate 30. Then, using photolithography and etching with a fifth photo mask, the second metal layer 44 is patterned to form the data line 12 and a top electrode Cs2 of the capacitor Cs. Meanwhile, the second metal layer 44 remaining in the first via 40I and the second via 40II provides electrical connections, and the second metal layer 44 disposed on the pixel electrode 20 is removed. In addition, during the etching step, a first opening 46I and a second opening 46II are respectively formed in the two island structures 39I and 39II, thus the second metal layer 44 is separated to serve as a source/drain electrode 44I/44II and the doped amorphous silicon layer 38 is separated to serve as a source/drain diffusion region 38I/38II. The amorphous silicon layer 36 exposed under the opening 46I/46II serves as a channel region. This completes the two a-Si:H TFTs 18I and 18II shown in FIG. 1.

Figure 2G:
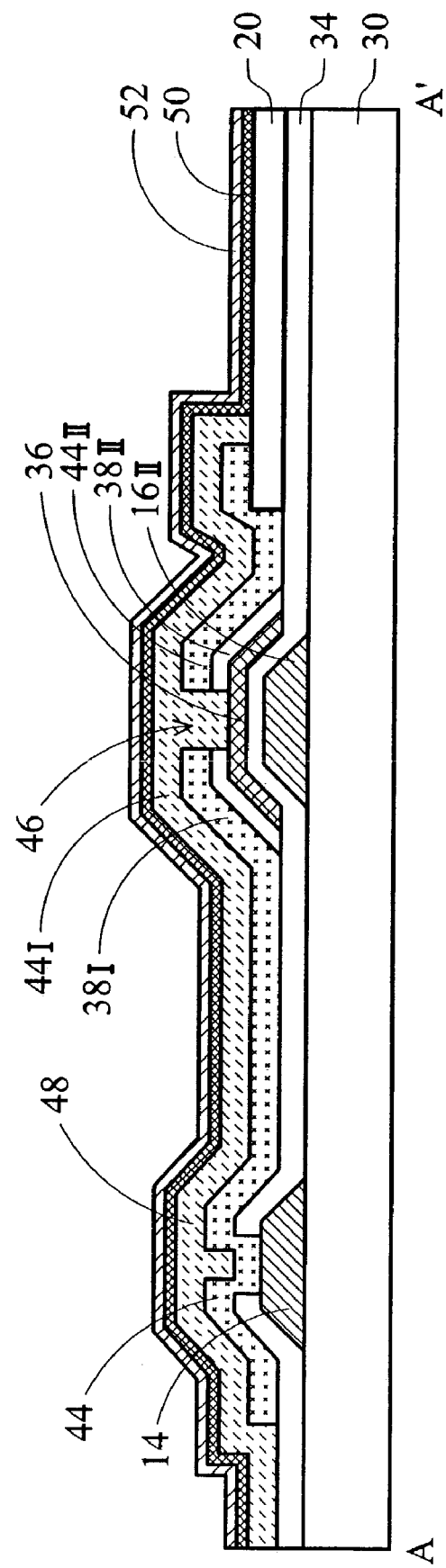
Figure 3G:
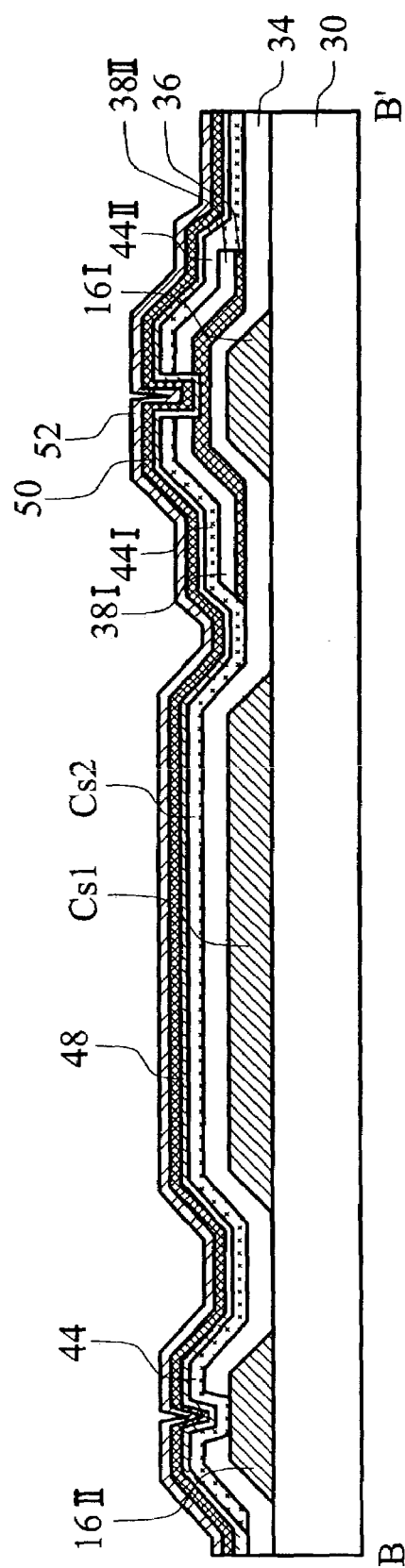

As shown in FIGS. 2F and 3F, a protective layer 48 is deposited on the entire surface of the transparent insulating substrate 30. Then, using photolithography and etching with a sixth photo mask, the protective layer 48 disposed on the pixel electrode 20 is removed. This completes the a-Si:H TFT process. Thereafter, as shown in FIGS. 2G and 3G, based on a traditional AM-OLED process, an organic/polymer luminescent layer 50 and a cathode metal layer 52 are successively deposited on the transparent insulating substrate 30 by vapor deposition. This completes the AM-OLED process.

In addition, by providing an appropriate modification of the thickness of the gate-insulating layer 34 and the growth rate of the amorphous silicon layer 36, the on-current of the a-Si:H TFT 18 can be further increased. Preferably, the thickness of the gate-insulating layer 34 can be reduced to less than 3000 Å, and the growth rate of the amorphous silicon layer 36 can be lowered to less than 4.0 Å/s.

Compared with the prior LTPS TFT process, the present invention integrates the a-Si:H TFT process into the AM-OLED process, thus only six photo masks with photolithography-etching processes are required to complete the electrode array in the pixel areas 10. This effectively increases the process costs, improves the yield of the a-Si:H TFT 18, and provides capability of mass production in large-size panel applications. In addition, by providing an appropriate modification of the thickness of the gate-insulating layer 34 and the growth rate of the amorphous silicon layer 36, the on-current of the a-Si:H TFT 18 can be further increased.

[Second Embodiment]

Before the vapor deposition of the organic/polymer luminescent layer 50 and a cathode metal layer 52, a rinsing process is required to clean the surface of the substrate 30. In order to prevent the exposed amorphous silicon layer 36 from damage from the UV light or plasma in the rinsing, the second embodiment of the present invention further provides a shielding structure to protect the amorphous silicon layer 36.

FIG. 4A is a cross-section along line A–A' of FIG. 1 to show the a-Si:H TFT process of the AM-OLED according to the second embodiment of the present invention. FIG. 4B is a cross-section along line B–B' of FIG. 1 to show the a-Si:H TFT process of the AM-OLED according to the second embodiment of the present invention.

According the photolithography-etching processes with the six photo masks as described in the first embodiment, the two a-Si:H TFTs 18I and 18II are formed on the transparent insulating substrate 30. Then, after forming the pattern of the protective layer 48, a shielding layer 49 is formed to cover the protective layer 48 and expose the pixel electrode 20. Thus, the shielding layer 49 can prevent the amorphous silicon layer 36 being damaged from the UV light or plasma in the sequential rinsing process, resulting in decreasing the threshold voltage and the leakage current caused by the damage to the amorphous silicon layer 36.

Preferably, the shielding layer 49 is a single-layered structure of an opaque material, such as $CrO_x$. Alternatively, the shielding layer 49 is a double-layered structure of a material containing polymer resin or an opaque metallic material, such as $SiO_x/Cr$.

[Third Embodiment]

Figure 5:
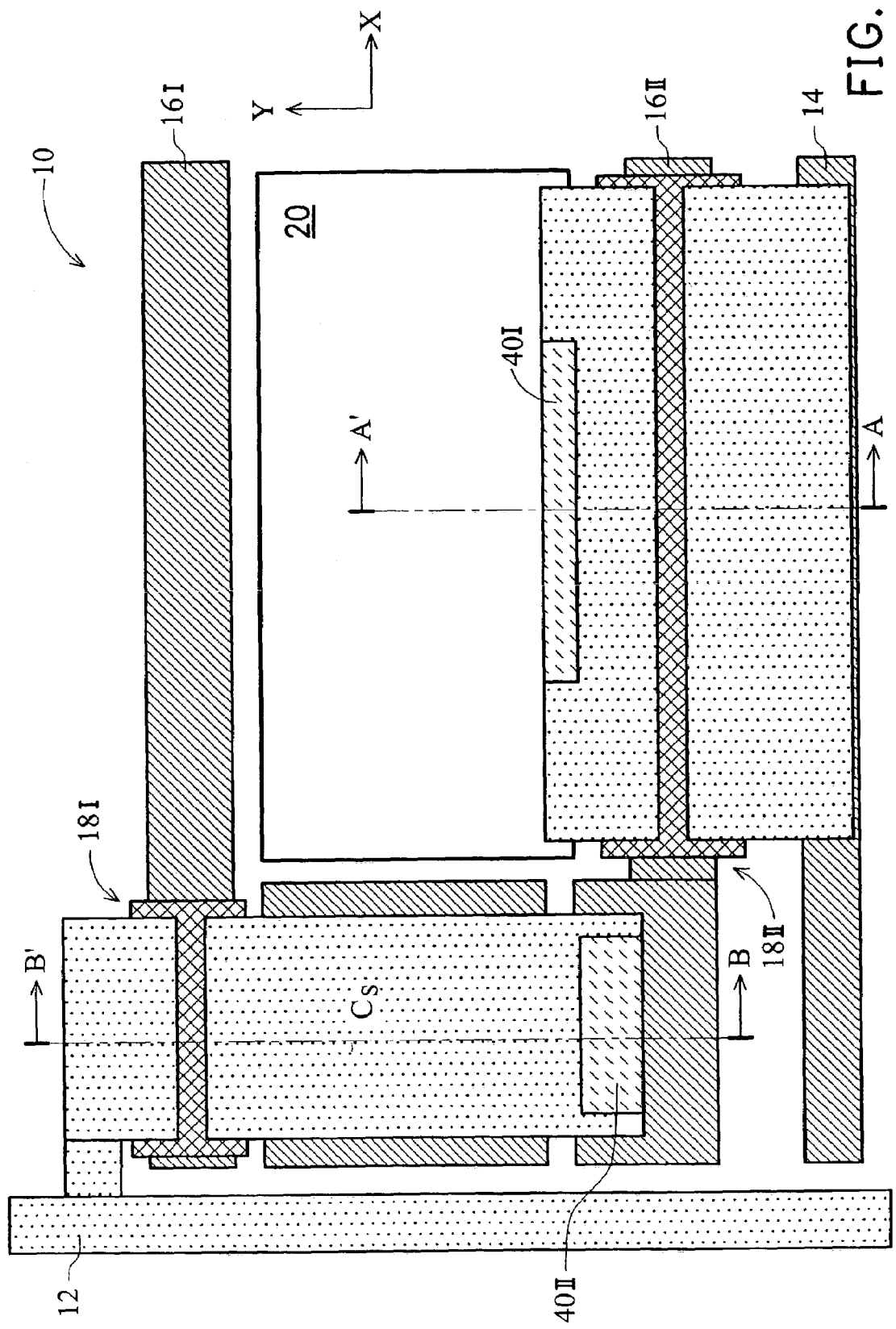
FIG. 5 is a top view showing a-Si:H TFTs of an AM-OLED according to the third embodiment of the present invention.

FIG. 5 is a top view showing a-Si:H TFTs of an AM-OLED according to the third embodiment of the present invention. The third embodiment provides an AM-OLED with a-Si:H TFTs the same as the structure shown in FIG. 1 except for the position of the first via 40I. It is noted that the position of first via 40I over the source line 14 in the first embodiment is changed to a position near the pixel electrode 20 in the third embodiment.

[Fourth Embodiment]

Figure 6A:
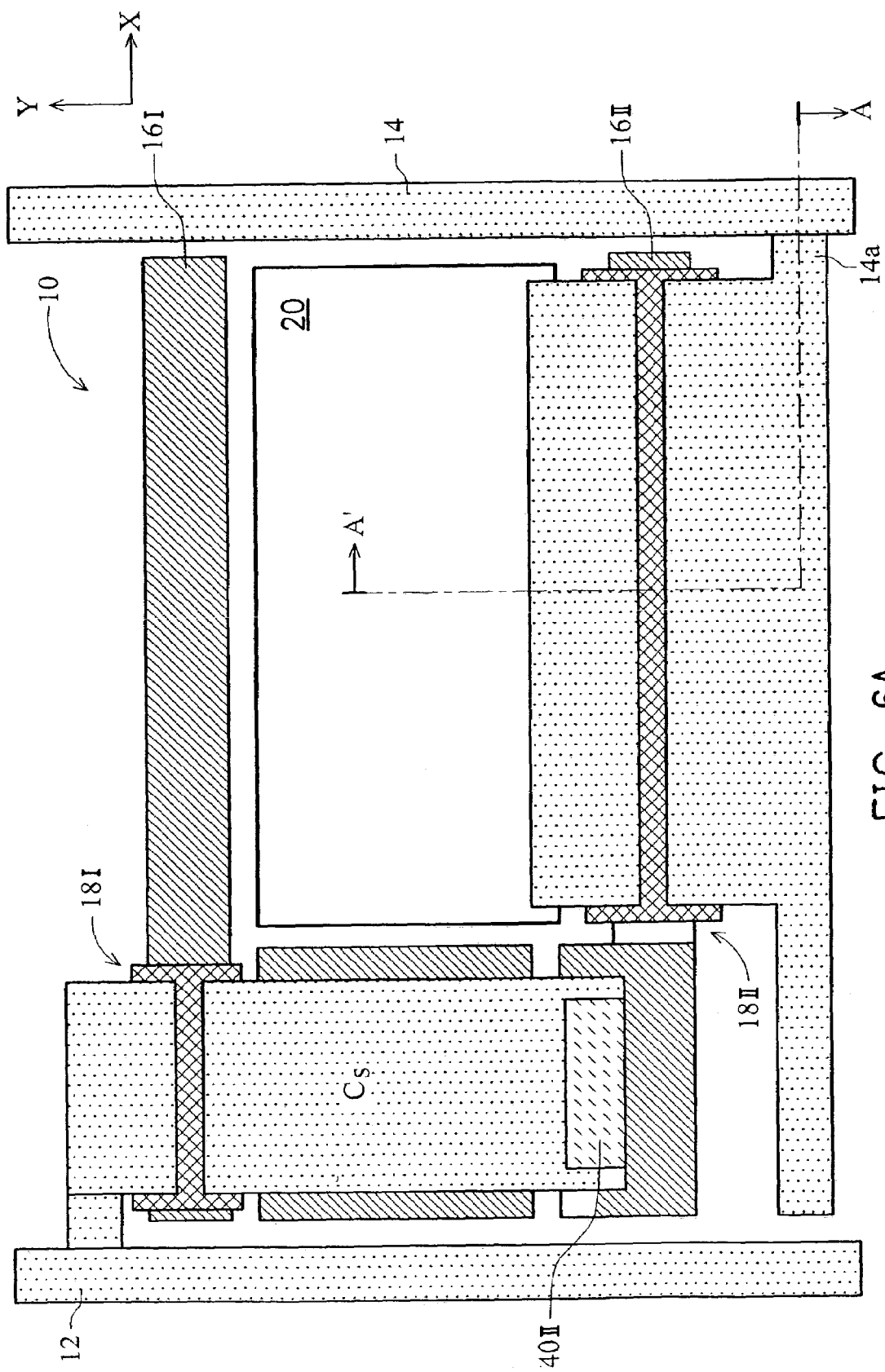
FIG. 6A is a top view showing an a-Si:H TFT of an AM-OLED according to the fourth embodiment of the present invention.
Figure 6B:
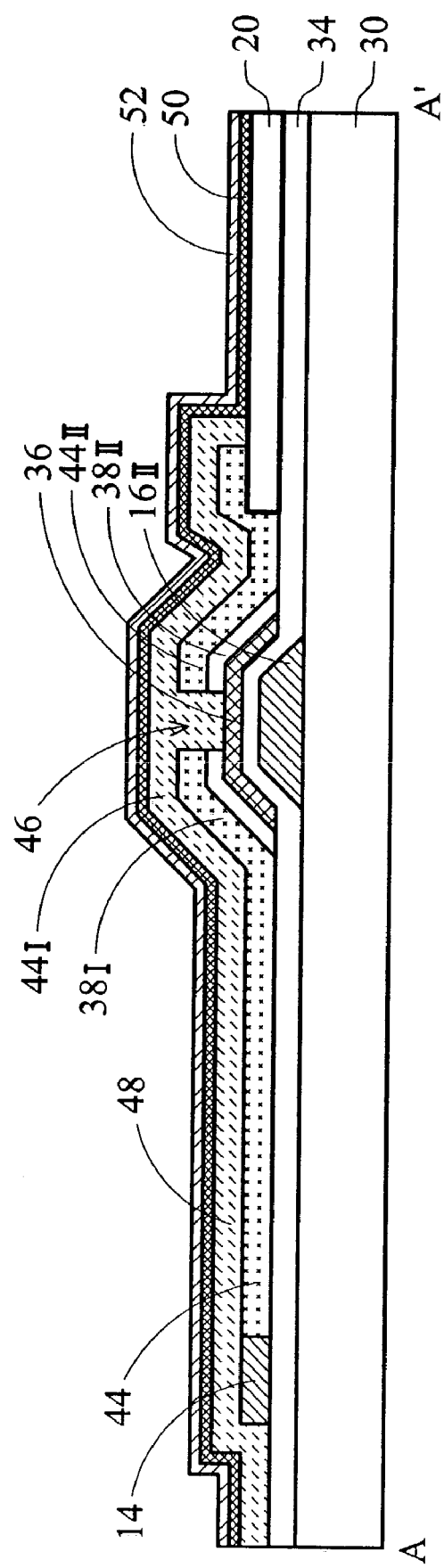
FIG. 6B is a cross-section along line A–A' of FIG. 6A according to the fourth embodiment of the present invention.

FIG. 6A is a top view showing an a-Si:H TFT of an AM-OLED according to the fourth embodiment of the present invention. FIG. 6B is a cross-section along line A–A' of FIG. 6A. The fourth embodiment provides an AM-OLED with a-Si:H TFTs the same as the structure shown in FIG. 1 except for the arrangement of the source line 14. It is noted that the X-direction extending arrangement of the source line 14 in the first embodiment is changed to the Y-direction extending arrangement in the fourth embodiment. Also, the source line 14 is made of the second metal layer 44 and patterned at the same step of patterning the data line 12 and the source/drain electrode 44I/44II. Moreover, the source line 14 has an extending portion 14a so that the first via 40I is omitted.

It is to be understood that the present invention is not limited to the embodiments described above, but encompasses any and all embodiments within the scope of the following claims.

What is claimed is:

1. A method of forming an active matrix organic light emitting display, comprising:
   providing a transparent insulating substrate;
   forming a first metal layer on the transparent insulating substrate and then using a first photolithography-etching process to pattern the first metal layer as a first scanning line extending along an X direction, a bottom electrode of a capacitor and a second scanning line extending along the X direction;
   successively forming a gate-insulating layer, an amorphous silicon layer and a doped amorphous silicon layer on the entire surface of the transparent insulating substrate;
   using a second photolithography-etching process to pattern the amorphous silicon layer and the doped amorphous silicon layer as a first island structure and a second island structure respectively within two predetermined TFT areas over the first scanning line and the second scanning line, in which the amorphous silicon layer and the doped amorphous silicon layer disposed outside the two predetermined TFT areas are removed;
   using a third photolithography-etching process to form a via in the gate-insulating layer to expose a part of the second scanning line that is outside the predetermined TFT area over the second scanning line;
   forming a transparent conductive layer on the entire surface of the transparent insulating substrate, and then using a fourth photolithography-etching process to pattern the transparent conductive layer as a pixel electrode;
   forming a second metal layer on the entire surface of the transparent insulating substrate, and then using a fifth photolithography-etching process to pattern the second metal layer as a data line extending along a Y direction and a top electrode of the capacitor, in which a first opening and a second opening are respectively formed in the first island structure and the second island structure until exposing the amorphous silicon layer to separate the second metal layer as a source/drain electrode and the doped amorphous silicon layer as a source/drain diffusion region;
   forming a protective layer on the entire surface of the transparent insulating substrate, and then using a sixth photolithography-etching process to remove the protective layer from the pixel electrode;
   forming a shielding layer on the entire surface of the transparent insulating substrate; and
   patterning the shielding layer, in which the shielding layer remains on the protective layer to shield the amorphous silicon layer and exposes the pixel electrode.

2. The method of forming an active matrix organic light emitting display according to claim 1, further comprising steps of:
   forming an organic luminescent layer on the entire surface of the transparent insulating layer; and
   forming a cathode metal layer on the organic luminescent layer.

3. The method of forming an active matrix organic light emitting display according to claim 1, wherein the shielding layer is a single-layered structure of an opaque material.

4. The method of forming an active matrix organic light emitting display according to claim 3, wherein the shielding layer is CrOx.

5. The method of forming an active matrix organic light emitting display according to claim 1, wherein the thickness of the gate-insulating layer is less than 3000 Å.

6. The method of forming an active matrix organic light emitting display according to claim 1, wherein the growth rate of the amorphous silicon layer is less than 4.0 Å/s.

7. The method of forming an active matrix organic light emitting display according to claim 1, wherein the transparent conductive layer is an ITO layer.

8. The method of forming an active matrix organic light emitting display according to claim 1, wherein when using the first photolithography process, the first metal layer is patterned as a source line extending along the X direction.

9. The method of forming an active matrix organic light emitting display according to claim 8, wherein the first scanning line, the second scanning line and the source line are arranged in parallel and in sequence, and the bottom electrode of the capacitor is disposed between the first scanning line and the second scanning line.

10. The method of forming an active matrix organic light emitting display according to claim 1, wherein when using the fifth photolithography-etching process, the second metal layer is patterned as a source line extending along the Y direction.

11. The method of forming an active matrix organic light emitting display according to claim 1, wherein the shielding layer is a double-layered structure of a material containing polymer resin or an opaque metallic material.

12. The method of forming an active matrix organic light emitting display according to claim 1, wherein the shielding layer is a double-layered structure of a material containing SiOx or Cr.

13. A method of forming an active matrix organic light emitting display, comprising:

providing a transparent insulating substrate;

forming a first metal layer on the transparent insulating substrate and then using a first photolithography-etching process to pattern the first metal layer as a first scanning line extending along an X direction, a bottom electrode of a capacitor and a second scanning line extending along the X direction;

successively forming a gate-insulating layer, an amorphous silicon layer and a doped amorphous silicon layer on the entire surface of the transparent insulating substrate;

using a second photolithography-etching process to pattern the amorphous silicon layer and the doped amorphous silicon layer as a first island structure and a second island structure respectively within two predetermined TFT areas over the first scanning line and the second scanning line, in which the amorphous silicon layer and the doped amorphous silicon layer disposed outside the two predetermined TFT areas are removed;

using a third photolithography-etching process to form a via in the gate-insulating layer to expose a part of the second scanning line that is outside the predetermined TFT area over the second scanning line;

forming a transparent conductive layer on the entire surface of the transparent insulating substrate, and then using a fourth photolithography-etching process to pattern the transparent conductive layer as a pixel electrode;

forming a second metal layer on the entire surface of the transparent insulating substrate, and then using a fifth photolithography-etching process to pattern the second metal layer as a data line extending along a Y direction and a top electrode of the capacitor, in which a first opening and a second opening are respectively formed in the first island structure and the second island structure until exposing the amorphous silicon layer to separate the second metal layer as a source/drain electrode and the doped amorphous silicon layer as a source/drain diffusion region;

forming a protective layer on the entire surface of the transparent insulating substrate, and then using a sixth photolithography-etching process to remove the protective layer from the pixel electrode;

forming a shielding layer on the entire surface of the transparent insulating substrate; and patterning the shielding layer, in which the shielding layer remains on the protective layer to shield the amorphous silicon layer and exposes the pixel electrode;

wherein the growth rate of the amorphous silicon layer is less than 4.0 Å/s; and wherein the thickness of the gate-insulating layer is less than 3000 Å.

14. The method of forming an active matrix organic light emitting display according to claim 13, wherein when using the first photolithography process, the first metal layer is patterned as a source line extending along the X direction.

15. The method of forming an active matrix organic light emitting display according to claim 14, wherein the first scanning line, the second scanning line and the source line are arranged in parallel and in sequence, and the bottom electrode of the capacitor is disposed between the first scanning line and the second scanning line.

16. The method of forming an active matrix organic light emitting display according to claim 13, wherein when using the fifth photolithography-etching process, the second metal layer is patterned as a source line extending along the Y direction.

* * * * *